US005528466A

United States Patent [19]

Lim et al.

[11] Patent Number: 5,528,466
[45] Date of Patent: Jun. 18, 1996

[54] ASSEMBLY FOR MOUNTING AND COOLING A PLURALITY OF INTEGRATED CIRCUIT CHIPS USING ELASTOMERIC CONNECTORS AND A LID

[75] Inventors: Samuel S. S. Lim; Siew K. Tan, both of Singapore, Singapore

[73] Assignee: Sunright Limited, Singapore, Singapore

[21] Appl. No.: 312,467

[22] Filed: Sep. 26, 1994

Related U.S. Application Data

[63] Continuation-in-part of Ser. No. 73,602, Jun. 4, 1993, abandoned, which is a continuation of Ser. No. 790,509, Nov. 12, 1991, abandoned.

[51] Int. Cl.$^6$ ............................... H05K 7/20; H05K 7/12
[52] U.S. Cl. .................. 361/820; 361/695; 361/767; 361/769; 361/771; 439/66; 439/73; 439/91
[58] Field of Search ..................... 174/16.3, 15.1, 174/15.2, 16.2, 52.1, 52.4; 206/332, 334; 220/321, 326, 337; 324/760, 758, 765; 361/728, 760, 769, 807, 808, 809, 820, 688, 690, 691–695, 715, 716, 767, 769, 771; 439/66, 68, 73, 70–72, 525, 329–331, 91

[56] References Cited

U.S. PATENT DOCUMENTS

| | | | |
|---|---|---|---|
| 3,877,064 | 4/1975 | Sheingold et al. | 357/74 |
| 3,917,984 | 11/1975 | Kong et al. | 317/101 |
| 3,982,320 | 9/1976 | Buchoff et al. | 29/630 |
| 4,166,665 | 9/1979 | Cutchaw | 439/487 |
| 4,288,841 | 9/1981 | Gogal | 361/414 |
| 4,324,040 | 4/1982 | Gottlieb | 29/829 |
| 4,593,961 | 6/1986 | Cosmo | 339/61 |
| 4,652,973 | 3/1987 | Baker et al. | 361/395 |
| 4,699,593 | 10/1987 | Grabbe et al. | 439/71 |
| 4,706,161 | 11/1987 | Buckingham | 361/220 |
| 4,717,346 | 1/1988 | Yoshizaki | 439/71 |
| 4,758,176 | 7/1988 | Abe et al. | 439/72 |
| 4,766,371 | 8/1988 | Moriya | 324/158 |
| 4,778,950 | 10/1988 | Lee et al. | 174/356 |
| 4,899,107 | 2/1990 | Corbett et al. | 324/158 |
| 4,955,818 | 9/1990 | Strange et al. | 439/86 |
| 5,000,696 | 3/1991 | Matsuoka et al. | 439/331 |
| 5,086,269 | 2/1992 | Nobi | 324/158 |
| 5,100,332 | 3/1992 | Egawa | 439/72 |
| 5,127,837 | 7/1992 | Shah et al. | 439/73 |
| 5,175,491 | 12/1992 | Ewers | 324/158 |
| 5,196,785 | 3/1993 | Douglas | 324/158 |
| 5,206,792 | 4/1993 | Reynolds | 361/386 |
| 5,243,498 | 9/1993 | Scofield | 361/767 |
| 5,273,441 | 12/1993 | Volz et al. | 439/72 |
| 5,302,891 | 4/1994 | Wood et al. | 324/158 |
| 5,360,348 | 11/1994 | Johnson | 439/72 |

FOREIGN PATENT DOCUMENTS

| | | | |
|---|---|---|---|
| 2-27676 | 1/1990 | Japan | 439/73 |

OTHER PUBLICATIONS

Research Disclosure "Vacuum Attachment of Heat Sink during Testing" Jan. 1993, No. 345.
*Elastomeric Connector Catalog*, Elastomeric Technologies, Inc. 1989.
Buchoff, *Solving High Density Electronic Problems With Elastomeric Connectors*, Elastomeric Technologies, Inc. 1989.
*Elastomeric Connector Catalog*, Elastomeric Technologies, Inc. 1989.

*Primary Examiner*—Donald A. Sparks

[57] ABSTRACT

An assembly for mounting a plurality of electrical components having terminals with leads onto a surface of a printed circuit board is disclosed. The assembly includes a substantially planar configured electrically insulated body member having top to bottom surfaces. Cavities extend through the body member and are dimensioned for receiving an electrical component and holding the component laterally by the walls defining the cavity. An elastomer element with conductive portions is positioned adjacent to the bottom surface of the cavities and receives the leads of electrical components. A lid is connected to the body member and movable from an open position for allowing insertion and removal of electrical components to and from the cavities, and a closed position where the lid covers the cavities. The lid includes plungers for pressing without excessive force the leads of the electrical components against the elastomeric connector(s) and into contact with the wiring pattern on a printed circuit board positioned adjacent the bottom surface of the body when the lid is in its closed position.

21 Claims, 5 Drawing Sheets

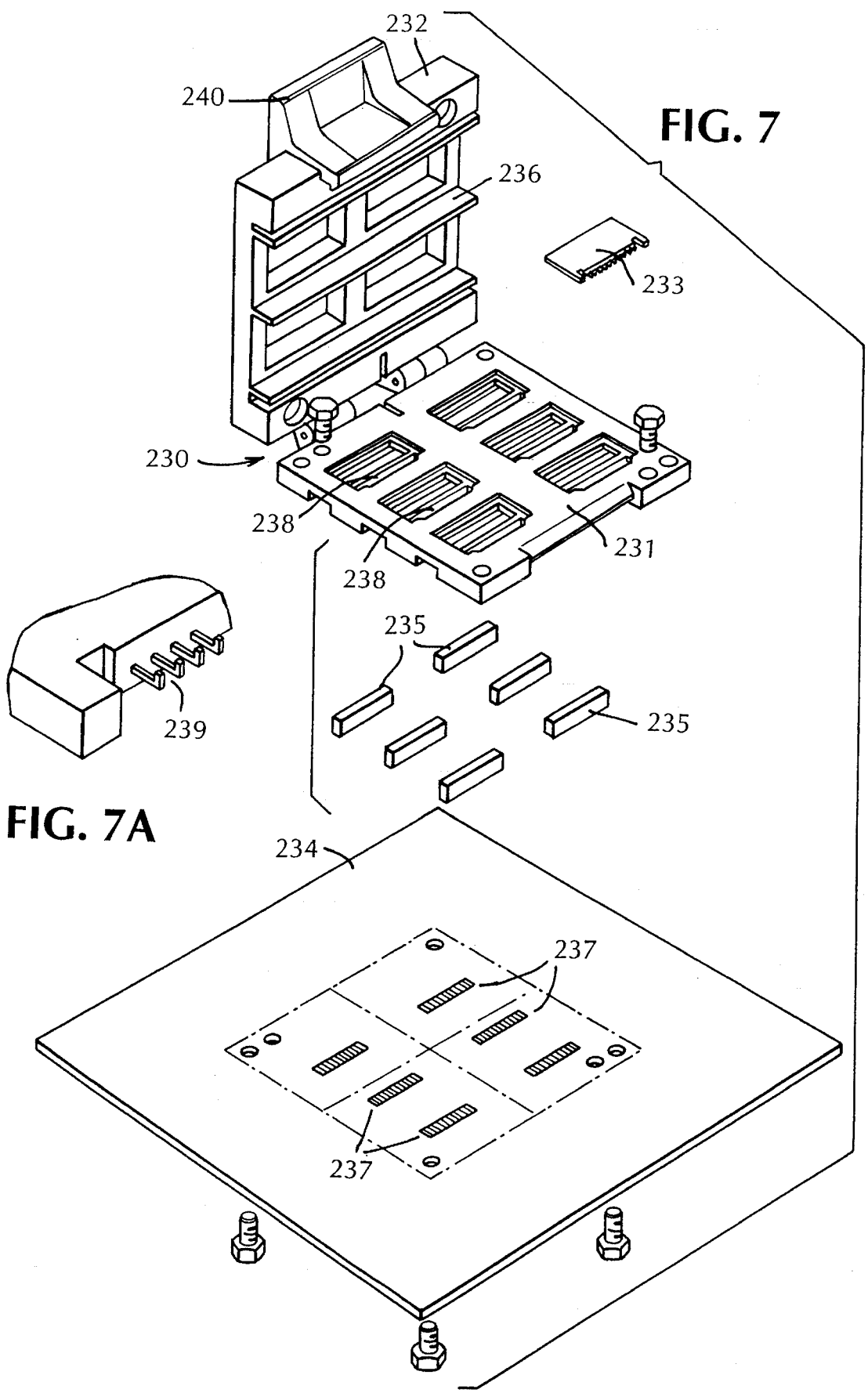

ASSEMBLY FOR MOUNTING AND COOLING A PLURALITY OF INTEGRATED CIRCUIT CHIPS USING ELASTOMERIC CONNECTORS AND A LID

This application is a continuation-in-part application of U.S. patent application Ser. No. 08/073,602, filed Jun. 4, 1993, now abandoned, which is a continuation of U.S. patent application Ser. No. 07/790,509, filed Nov. 12, 1991, now abandoned, the disclosures which are hereby incorporated by reference.

FIELD OF THE INVENTION

This invention relates to the mounting of circuit components onto the surface of printed circuit boards while electrical connection is secured between leads of the electrical component and a printed wiring pattern on the printed circuit board. More particularly, this invention relates to an assembly for connecting a plurality of electrical components such as surface mounted integrated circuits to a circuit board using elastomeric elements for use such as in a testing or burn-in application, while also increasing the density of integrated circuits which may be connected to the circuit board.

DESCRIPTION OF THE PRIOR ART

Integrated Circuits are widely used in various industries such as medical equipment, computers, electronic instruments, military equipment, etc. Typically, a chip or a chip which is mounted on a carrier is referred to as an integrated circuit. Electrical connections extend from the terminals provided on the edges of the component to the electrical circuitry of the chip. A common arrangement in the art has terminals or metal leads extending on two opposite sides of the component forming what is known as a dual-in-line package.

To connect to the circuitry of the printed circuit board, an integrated circuit may be soldered directly to the printed circuit board or it could be inserted on a dual-in-line socket which has been permanently soldered into place on the printed circuit board. See U.S. Pat. No. 3,917,984 issued Nov. 4, 1985 to G. C. Kong et al., which describes a printed circuit board having a plurality of sockets mounted thereon. The socket is usually provided with spring loaded contact pins to make electrical connections between the integrated circuit and the printed circuit board when the integrated circuit component is inserted into the socket.

Presently, integrated circuits are progressively becoming miniaturized with more added functions. They are also produced in different shapes and sizes with terminals or leads extending from various sides of the chip carrier, fanning out and bent in different configurations. The leads of the chip carriers are also finer, narrower and packed in higher pin density. Further, to improve thermal dissipation of the chips during operation, heat sinks are additionally attached to the body of the integrated circuits.

With all of these complexities, a socket which has spring loaded contact pins to hold the leads of an integrated circuit has become quite difficult to manufacture. The width of the leads are thinner and the pitch of the leads are closer. Therefore, the spring loaded contacts are required to be very narrow and placed very closely to one another. With present technology, the width of the spring loaded contacts has reached the minimum possible and any attempt to make these contacts even narrower increases the cost of manufacturing a socket substantially. Moreover, with leads bent in different configurations, the spring loaded contacts must be made longer to take into consideration factors such as the insertion and withdrawal retention force of the spring, etc. With long spring loaded contacts, undesirable inductances and capacitances are introduced, limiting the switching times which are particularly critical for high frequency integrated circuits.

To overcome the problem associated with spring loaded contacts, conductive elastomeric elements have been found to be useful as effective replacements. For example, Baker, U.S. Pat. No. 4,652,973 describes and illustrates an apparatus for mounting chip carrier devices onto printed circuit boards using elastomeric contacts. Also Strange et al., U.S. Pat. No. 4,955,818 suggests an apparatus using elastomeric elements as contacts. The Baker and Strange et al. patents are examples of using elastomeric elements as effect electrical connections between the chip carrier and the printed circuit board.

Elastomeric elements and its applications are also discussed generally in Buchoff "Solving High Density Electronic Problems With Elastomeric Connectors" article published at the March 1990 Nepcon Technical Program Conference in Anaheim and in Lee et al. U.S. Pat. No. 4,778,950. Elastomeric elements are made of flexible insulator material and conductors. The electrically insulated conductors can be aligned with the contact surface of the printed circuit board and the leads of the integrated circuit to form electrical connections. An advantage of an elastomeric element is that it is replaceable.

In the Strange et al. patent, a housing with a recess is provided to receive the chip carrier. The electrical connection as well as the contact between the lead and chip carrier is maintained by inserting and retaining the chip carrier in the recess. However, without a lid or cover, there is no assurance that proper contact between the lead and the elastomeric elements is established or maintained. This is particularly important during environmental testing, when the various parts of a device must be held together with a high degree of stability, despite external vibration or large temperature changes. Further, as previously described, leads fanning out from the integrated circuits are typically fragile and thin. These integrated circuits cannot simply "be fitted" to the printed circuit board without applying a force to hold the integrated circuits to the socket.

In the Baker patent, contact is made between the chip and the printed circuit board from the bottom side of the chip carrier. However, the chip carrier described does not have protruding metal leads. Therefore, designing the mounting assembly becomes complex when chip carriers have protruding metal leads bent in various configurations and with attached heat sinks. Although Baker's design uses a cover to apply pressure, the cover is provided as a separate unit, introducing an extra step for mounting the assembly. Also, the cover provided in Baker restricts air flow to the integrated circuits, causing heat to be built up during the burn-in process.

Very recently, Elastomeric Technologies Inc., published an "Elastomeric Connector Catalog—ETI 114-2-90-SM" and proposed on page 64, an integrated circuit socket assembly (called Plastic Quad Flat Pack Socket) useful for testing, burn-in and the like. The proposed socket assembly has an electrically insulating housing comprising a body member and a lid member hinged on one side. Elastomeric elements are disposed inside a center cavity in the body member for electrical connection with the metal leads protruding from an integrated circuit chip or carrier.

Although this assembly provides a quick action lid for easy insertion, it has limited application. There is no element provided to exert force on the leads to force them into contact with the elastomeric elements. In this proposed socket, the pressure is exerted on the bottom of the integrated circuits, causing the leads to be potentially bent, so that some leads of the integrated circuits may not be entirely flat, causing poor contact or no contact in the worst case. In other words, without any guide member to force the leads on to the elastomeric elements, there is no assurance of an effective electrical connection between all the leads of the integrated circuit carrier and the elastomeric elements. As obvious to those skilled in the art, those potential issues would arise in applying stress on the body of the integrated circuit in the burn-in/testing process.

Moreover, since the elastomeric elements are to be inserted inside the cavity in the body member of the housing, it is difficult to wipe off fine foreign particles or dust that settles on the elastomer causing "shorts" or poor contacts. Had the elastomer elements been designed to be flush with the surface of the body member, the condition of the elastomer would be observable during loading of the integrated circuits and cleaning or maintenance required can be easily performed to ensure effective electrical connections between the leads and the elastomer elements.

The copending '602 parent application is directed to an assembly for mounting an electrical component, such as an integrated circuit, onto a printed circuit board by using a socket mounting assembly involving a two-piece housing hinged together on one side and a spring locking lever on the other end. The electrical component is sandwiched between the two electrically insulated housings. The bottom housing member is fitted with an elastomeric element or elements to form electrical contact between the component and the printed circuit board for testing, burn-in and other uses.

It would be advantageous, however, if multiple surface mount integrated circuits could be connected to a circuit board using elastomeric elements without the need for singulated sockets, while also increasing the density of integrated circuits which may be connected thereto. Such an apparatus would not only be able to accept a plurality of integrated circuits in close density, but also should allow sufficient cooling of the closely packed components.

SUMMARY OF THE INVENTION

It is therefore an object of the present invention to increase the density of electrical components which can be mounted to the surface of a printed circuit board for use such as in testing and burn-in applications, and other uses.

It is another object of the present invention to interconnect surface mounted integrated circuit devices to a circuit board for use such as in testing and burn-in applications with an increased density of the electrical components.

It is still another object of the present invention to allow cooling of electrical components that are mounted on the surface of a printed circuit board for use such as in testing or burn-in applications.

It is yet another object of the present invention to allow insertion of electrical components into cavities extending in a body member without damaging the leads extending from the electrical components.

In accordance with the present invention, an assembly for mounting a plurality of electrical components having terminals with leads onto a surface of a printed circuit board is provided. The assembly includes a substantially planar configured electrically insulating body member having top and bottom surfaces. The body member has a plurality of cavities extending therethrough which are dimensioned for receiving within each cavity an electrical component and holding the component laterally by the walls defining the cavity. Typically, the electrical components are surface mounted integrated circuit packages or carriers.

An elastomer material with conductive portions is positioned adjacent to the bottom surface of the cavities for receiving the leads of electrical components mounted within the respective cavities. A lid is pivotally connected to the body member and movable from an open position for facilitating insertion and removal of components to and from the cavities and a closed position where the lid covers the cavities.

The lid includes means for pressing without excessive force the terminal leads of an electrical component against the elastomer material and into contact with a wiring pattern on a printed circuit board positioned adjacent to the bottom surface of the body when the lid is in the closed position.

In one aspect of the invention the elastomer material comprises individual elastomeric elements that are received within each cavity. These elastomeric elements typically are rectangular configured to fit precisely within the cavities. In still another aspect of the invention, the elastomer material comprises a sheet of elastomeric material that is positioned against the bottom surface of the body member. The circuit board then engages the elastomeric sheet.

In another aspect of the present invention, the pressure means positioned on the lid includes a plurality of plungers that are aligned with respective cavities for engaging the leads on the body of respective components. The electrical components typically include a component body having terminals with leads extending therefrom. The plungers can be configured for engaging the leads of an electrical component without applying pressure on the component body.

When the lid is in its closed position, an air space exists between the upper surface of the body member and the lid to enable cooling of the electrical components. The plungers can define the air space by selectively spacing the lid from the top surface of the body member. In an alternate embodiment the lid can be designed so that in its closed position it automatically creates an air space between the lid and the top surface of the body member. Air can be drawn by convection or forced into the air space defined between the lid and the top surface of the body member and along the top surface of any electrical components received in the cavities to assist in cooling of the components during testing or burn-in applications.

In one aspect of the present invention, a plurality of orifices are positioned in the lid for allowing airflow over the electrical components and through the lid. In another aspect of the present invention, a compressed air blower nozzle is positioned on the body member to blow air laterally over the top surface of the body member and over the components received in the cavities. In yet another aspect, compressed air can be directed through a hollow of the plunger directly over the electrical component. Air duct or runners in the lid distribute the air to the plunger.

In another aspect of the present invention, the circuit board is mounted to the lower surface of the body member by screws. In still another aspect of the present invention, the circuit board can be mounted by any other means such as an adhesive.

BRIEF DESCRIPTION OF THE DRAWINGS

The accompanying drawings illustrate the invention.

FIG. 7 is an exploded view of a rectangular chip carrier (vertical surface mount package) mounting apparatus according to still another embodiment of the present invention, showing a printed circuit board, a body member, a lid, an integrated circuit chip carrier and screws.

FIG. 7A is an enlarged view of the metal leads of the integrated circuit chip carrier in FIG. 7.

DETAILED DESCRIPTION OF THE PREFERRED EMBODIMENTS

Figure 1:
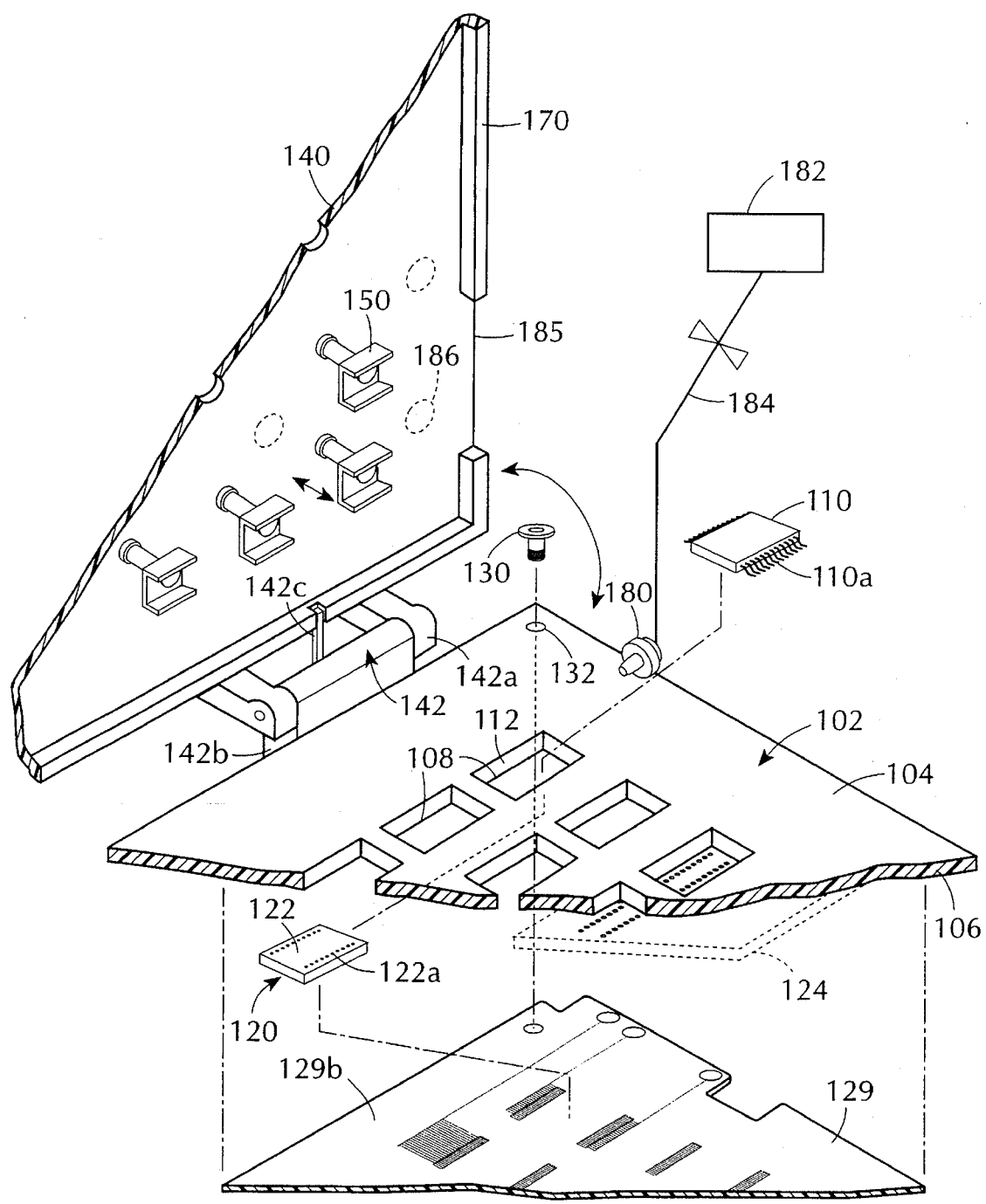
FIG. 1 is an exploded view of an embodiment of the present invention showing a design where a plurality of electrical components can be mounted in cavities formed in an electrically insulated body member and where either individual elastomeric elements or a larger elastomeric sheet can be used.

Referring now to FIGS. 1 through 6, there is illustrated one preferred embodiment of the assembly which mounts a plurality of electrical components having terminals with leads onto a surface of a printed circuit board for testing and burn-in applications as well as other uses. Reference numerals describing this embodiment begin with the 100 series.

As shown in the expanded view of FIG. 1, the assembly, indicated generally at 100, includes a substantially planar configured electrically insulated body member 102 defining respective top and bottom surfaces 104, 106. The body member 102 can be molded from plastic or other similar material by conventionally known plastic molding or other known techniques. The body member 102 includes a plurality of cavities 108 extending through the body member. The cavities 108 are dimensioned for receiving within each cavity an electrical component 110 such as a surface mounted integrated circuit package or carrier. The electrical component 110 in the illustrated embodiment is an integrated circuit chip formed as the well known chip carrier SOP or TSPO (Small Outline Package or Thin Small Outline Package). The chip has metal leads 110a fanned out in an orderly, opposing direction as shown in FIG. 1. The metal leads could also fan out from all sides (not illustrated). Each cavity 108 is configured to receive the electrical component 110 and hold the component laterally by the walls 112 defining the cavity 108.

An elastomer material, indicated generally at 120, is positioned adjacent to the bottom surface of the cavities 108 for receiving leads 110a of electrical component terminals mounted within respective cavities. As discussed in the above cited article "SOLVING HIGH DENSITY ELECTRONIC PROBLEMS WITH ELASTOMERIC CONNECTORS," there are two basic types of elastomeric conducting elements. One type, the layered elastomeric elements consists of alternating conductive and non-conductive layers of silicone rubber. The other type of elastomeric element, elastomeric metal-on-elastomer has metal traces on the surface of a silicone core or traces that traverse the core. Either type of elastomeric element may be used in the present invention.

In one aspect of the invention illustrated in FIG. 1, the elastomer material 120 is formed from individual elastomeric elements 122 that are received within each cavity 108. In the illustrated embodiments, the elastomer material 120 includes conductive portions 122A, which as shown in FIG. 1, are formed as two linear series of conductive portions that engage the leads 110A of the electrical component 110. The elements 122 can be bonded to the printed circuit board 129. The printed circuit board 129 has components 129a (passive surface mount resistors, capacitors, etc.) and these are mounted to the back of the circuit board (FIGS. 3–6). The printed circuit board 129 also includes a wiring circuit pattern or other copper traces, (the footprint) 129b. It is well known in the art that the spacing of the electric connections (pitch) on the footprint of the printed circuit board 129 is selected to be equal to or larger than the spacing of the conductive members of elastomeric elements.

In another aspect of the present invention, the elastomer material 120 is a sheet 124 of elastomeric material that is positioned against the bottom surface 106 of the body member 102 or to the circuit board 129. In either embodiment, whether using individual elastomeric elements 122, or the elastomeric sheet 124, the circuit board 129 can be secured adjacent to the bottom surface of the body member 102 by means of screws 130 which extend through orifices 132 in the body member to secure the circuit board 129 thereto.

Figure 4:
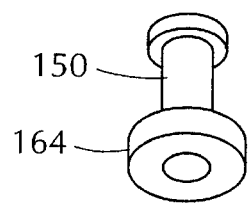
FIG. 4 is an isometric view of a plunger with a cylindrically configured end.
Figure 3:
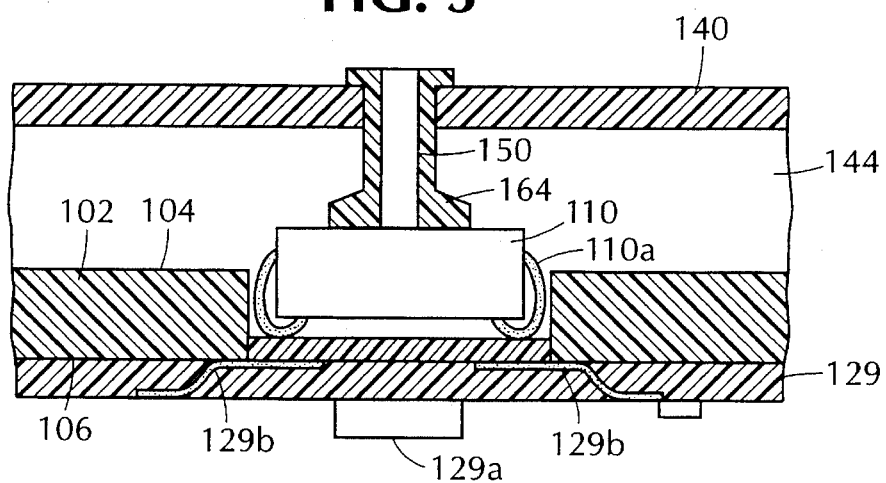
FIG. 3 is a side sectional view of the assembly showing the lid in its closed position and a plunger pressing the leads against an elastomeric element.
Figure 5:
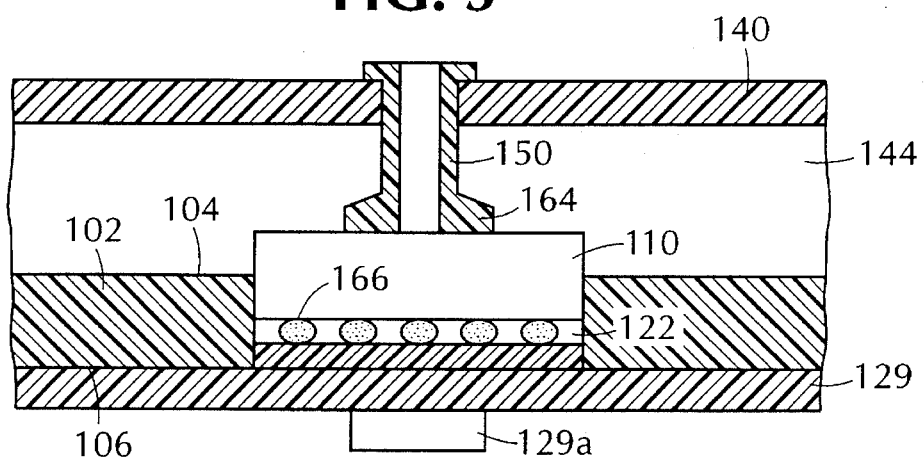
FIG. 5 is another side sectional view similar to that of FIG. 4 showing a different configuration of an electrical component with rigid "ball" leads.

As shown in FIG. 1, a lid 140 is pivotally connected to the body member 102 through a two-piece hinge, illustrated at 142, such as molded hinge components 142a, 142b on respective lid 140 and body 102. The lid 140 is movable from an open position (FIG. 1) to a closed position (FIGS. 3–6) where the lid covers the cavities 108. A flip latchet 143 is mounted on the lid 140 and engages a bracketed lock member 143a positioned on the body member to lock the lid in its closed position. When the lid 140 is open, electrical components can be inserted and removed to and from the cavities 108. When the lid 140 is in its closed position, an air space 144 is defined between the lid 140 and the top surface 104 of the body member 102 (FIGS. 3 through 5). The lid hinge 142 includes a spring 142c which allows the lid 140 to be held upward such that it remains in a perpendicular standing position at all times unless it is pushed down to lock the lid closed.

Figure 6:
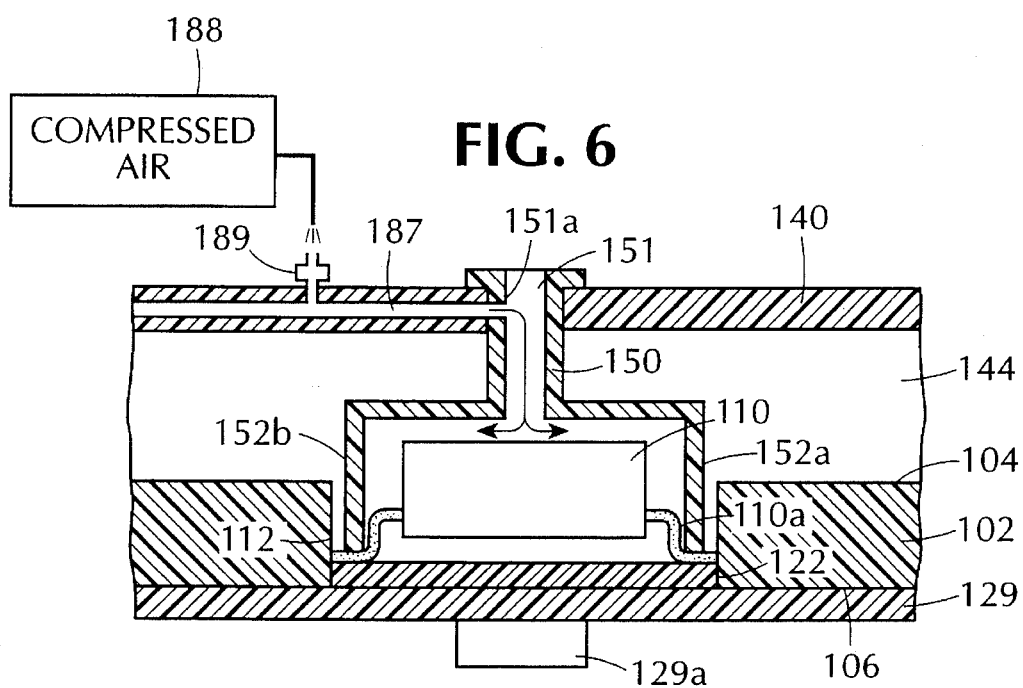
FIG. 6 is another side sectional view of the assembly showing a plunger configuration which engages "gull wing" leads.

As shown in FIGS. 1 through 6, the lid 140 includes means in the form of molded plungers 150 for pressing without excessive force the leads 110A of the electrical components against the elastomer material 120 and into contact with the wiring pattern of footprint 129b located on the circuit board when the lid is closed. In the illustrated embodiment, the plungers 150 are aligned with respective cavities 108 for engaging the leads 110a of respective components 10 (FIGS. 1 and 6). In that illustrated embodiment, the leads 110A are the "gull wing" type (e.g., SOP or TSOP packages) and structurally weak. Any excessive pressure on the component body 110 can cause potential bent leads resulting in poor contact between the leads and elastomer material.

Figure 6A:
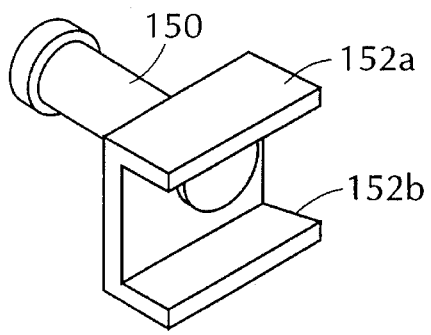
FIG. 6A is an isometric view of the plunger of FIG. 6 showing the plunger legs which engage the leads.
Figure 6B:
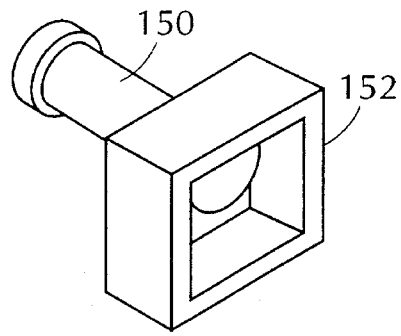
FIG. 6B is an isometric view of another plunger configuration where the plunger legs form a substantially rectangular configuration.

As shown in FIG. 6A, the plunger has two respective plunger legs 152A, 152B which engage the side leads 110A of the electrical component 110. FIG. 6B shows another embodiment of the plunger 150 where a rectangular configured leg pattern 152 (QFP packages) can engage a rectangular configured lead assembly (not illustrated).

FIG. 3 illustrates a surface mounted electrical component 110 with a "J" bend lead type 160 such as the SOJ and PLCC packages. These leads are generally stronger and less easy to bend compared to the "gull wing" lead type of FIGS. 1 and 6. Thus, a plunger 150 having a circular configured end 164 (FIG. 4) engages the top body portion of the electrical component 110 and forces the leads against the elastomeric element 122.

FIG. 5 illustrates a similar plunger configuration 150, 164 which applies pressure onto an electrical component having "ball" leads 166 which are very rigid. In all embodiments, the plungers can be molded, and the plungers depicted in FIG. 4 can be hollow.

In one aspect of the invention, the air space 144 defined by the lid 140 and the top surface 104 of the body member 102 can be defined by the length of the plungers 150 which allow the lid to be selectively spaced from the body member. Additionally, the air space 144 can be defined by a ridge 170 on the lid 140 or by other means providing an air space between the lid 140 and the top surface of the body member 102.

Referring now to FIG. 1 there is illustrated a compressed air nozzle 180 which is mounted on the side of the body member 102. The air nozzle 180 is connected to a source of compressed air 182 by compressed air lines 184. When the lid 140 is in its closed position, air can be blown over the upper surface 104 of the body member 102 which provides cooling to the electrical components 110 received in the slots 108. Compressed air flows over the upper surface 104 of the body member 102 within the air space and out the other side of the assembly. The lid 140 can include an opening 185 to create a space for the air nozzle 180 when the lid is closed.

Figure 2:
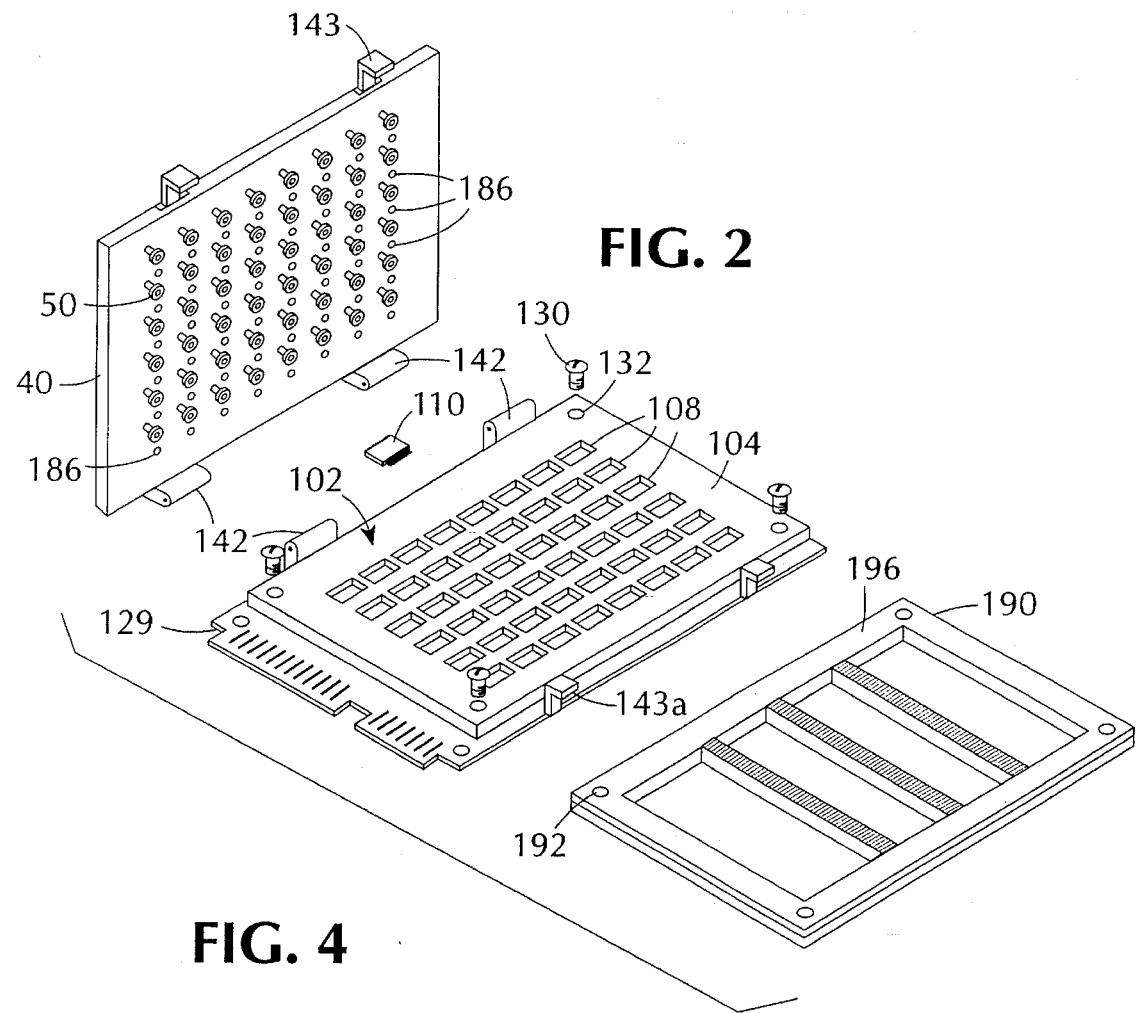
FIG. 2 is another exploded view of the embodiment of FIG. 1 showing a frame assembly for mounting the combination circuit board and body member thereto.

In another embodiment of the invention shown in FIG. 2, the lid 140 includes orifices 186 which allow air flow over the top surface 104 of the body member 102, over the electrical components and through the orifices 186. In another embodiment, the compressed air can be directed through the hollow 151 of the plunger. This means of cooling is especially advantageous for applications as shown in FIG. 6. The plunger 150 can include a side opening 151a which communicates with an air duct or runners 187 extending through the lid 140. A source of compressed air 188 connects to the runners via an air fitting 189 mounted on the lid 140.

As shown in FIG. 2, a frame 190, made from metal or other rigid material, secures the assembly formed by the circuit board 129 and body member 102. The frame 190 includes holes 192 for receiving screws for mounting the body member and circuit board combination thereto. The frame can include a layer of high temperature silicon 196 between the printed circuit board and frame. In a preferred testing operation, the assembly 100 is placed in a chamber in stacked configuration with other assemblies. A source of compressed air can automatically connect to the air nozzle 180 as the assembly is inserted within the chamber for subsequent burn-in or testing.

Figure 8:
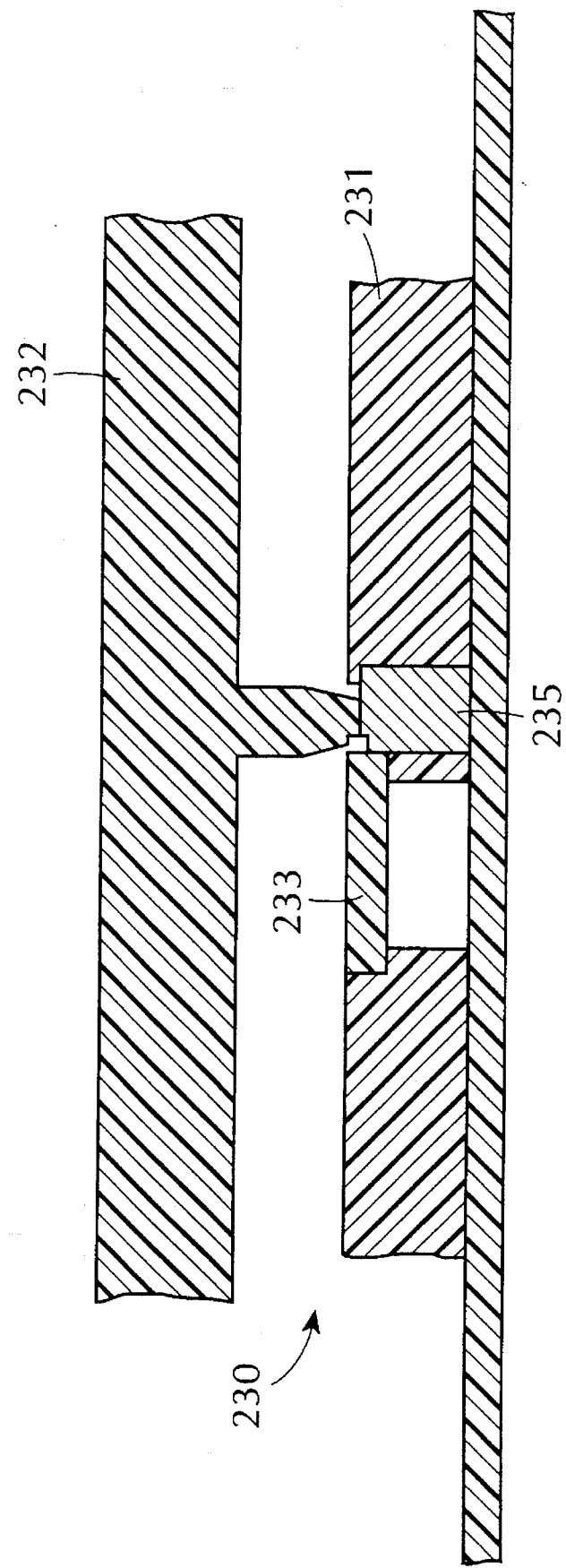
FIG. 8 is a sectional view of the rectangular chip carrier (vertical surface mount package) in the mounting assembly of FIG. 7.

In another embodiment of the present invention, FIGS. 7 and 8 illustrate a modified body member 231 which is designed to hold multiple integrated circuits. Reference numeral starting in the two hundred series are used in the foregoing description.

In the illustrated embodiments of FIGS. 7 and 8, a housing assembly 230 includes a body member 231 and a lid member 232 and is designed to accommodate six integrated circuit carriers 233. At least one side of each of those integrated circuit carriers has metal leads to be connected to a printed circuit board 234 via an elastomeric element 235.

The elastomeric elements 235 in the embodiment are individual rectangular elements. However, larger elements could be used. The elastomeric elements 235 are received within individual slots 238 which are formed in the body member 231 to extend the thickness of the body member 231. There are disposed three guide rails 236 for alignment between the integrated circuit carriers 233 and a footprint 237 on the printed circuit board 234. With the combination of the slots 238, the guide rails 236 and a spring lock lever 240 which applies clamping force to the integrated circuit carriers 233 and then the elastomeric elements 235, a good contact is maintained between the leads 239 of the integrated circuit carriers 233 and the footprint 237 on the printed circuit board 234.

The above embodiments of the invention offer several advantages in effecting electrical interconnections between circuitry of printed circuit boards and chip carriers through the use of elastomeric elements. Additionally, the assembly of the present invention allows cooling of a plurality of components which are mounted in high density. Those skilled in the art will immediately recognize the utility of the present invention in other areas of electrical connectors, such as display panel connectors.

While preferred embodiments have been described, various modifications and substitutions may be made without departing from the spirit and scope of the invention. Accordingly, it is understood that the present invention has been described by way of illustration and not limitation.

That which is claimed is:

1. An assembly for mounting a plurality of electrical components having terminals with leads onto a surface of a printed circuit board, comprising a substantially planar configured electrically insulating body member having top and bottom surfaces, said body member having a plurality of cavities extending therethrough and being dimensioned for receiving within each cavity an electrical component and holding the electrical component laterally by the walls defining the cavity, elastomeric means having conductive portions positioned adjacent to the bottom surface of said cavities for receiving the leads of the electrical components mounted within the respective cavities, a lid connected to the body member and movable from an open position for facilitating insertion and removal of the electrical components to and from the cavities and a closed position wherein the lid covers the cavities in spaced relation thereto forming an air space between the lid and the upper surface of the body member, said lid including means for engaging and pressing without excessive force the leads of each electrical component against the elastomeric means and into contact with the wiring pattern on a printed circuit board positioned adjacent the bottom surface of said body when the lid is in the closed position, and means for moving air in the air space defined between the lid and top surface of said body member and along the top surface of any electrical components received within the cavities to assist in cooling of the components during testing or burn-in applications, the air movement means comprising at least one nozzle mounted on the side of said body member for blowing compressed air over the upper surface of the body member and over the electrical components.

2. An assembly according to claim 1 wherein said air movement means comprises a plurality of orifices positioned in said lid for allowing air flow over said electrical components and through said lid.

3. An assembly according to claim 1 wherein said air movement means comprises means for blowing compressed air over the top surface of said body member and over respective electrical components mounted within the cavity.

4. An assembly according to claim 1 wherein said and pressing means is a plunger and is provided with a hollow and wherein said air movement means comprises means for blowing compressed air through the hollow of the plunger to be directed over the electrical component.

5. An assembly according to claim 1 wherein said elastomer means comprises individual elastomeric elements that are received within each cavity.

6. An assembly according to claim 1 wherein said elastomer means comprises a sheet of elastomeric material that is positioned adjacent the bottom surface of the body member.

7. An assembly according to claim 1 wherein said pressure means on said lid includes a plurality of plungers that are aligned with respective cavities for engaging the leads of respective components.

8. An assembly according to claim 7 wherein the electrical components include a component body having terminals with leads extending therefrom, and wherein said plungers are configured for engaging the leads of an electrical component without applying pressure onto the component body.

9. An assembly according to claim 7 wherein said plungers define said air space between the upper surface of said body member and said lid.

10. An assembly according to claim 1 including means for mounting a circuit board onto the lower surface of said body member.

11. An assembly according to claim 10 wherein said mounting means comprises screws securing a circuit board and body member together.

12. An assembly according to claim 1 including a frame for mounting the body member and circuit board secured thereto.

13. An assembly according to claim 1 wherein said lid is pivotally connected to said body member.

14. An assembly for mounting a plurality of electrical components having terminals with leads onto a surface of a printed circuit board, comprising a substantially planar configured electrically insulating body member having top and bottom surfaces, said body member having a plurality of cavities extending therethrough and being dimensioned for receiving within each cavity an electrical component and holding the electrical component laterally by the walls defining the cavity, elastomeric means having conductive portions positioned adjacent to the bottom surface of the cavities for receiving the leads of the electrical components mounted with the respective cavities, a lid connected to the body member and movable from an open position for facilitating insertion and removal of the electrical components to and from the cavities and a closed position wherein the lid covers the cavities in spaced relation thereto forming an air space between the lid and the upper surface of the body member, said lid including means for engaging and pressing without excessive force the leads of each electrical component against the elastomeric means and into contact with the wiring pattern on a printed circuit board positioned adjacent the bottom surface of said body when the lid is in the closed position, and wherein the engaging and pressing means are plungers and are each provided with a hollow and a side opening, said lid including an air runner system extending therethrough, each side opening of said plunger communicating with said air runner system, and a source of compressed air connected to said air runner system for blowing air through the air runner system, into said plungers, and outward along the top surface of any electrical components received within the cavities to assist in cooling of the components during testing or burn-in applications.

15. An assembly according to claim 14 wherein said elastomer means comprises individual elastomeric elements that are received within each cavity.

16. An assembly according to claim 14 wherein said elastomer means comprises a sheet of elastomeric material that is positioned adjacent the bottom surface of the body member.

17. An assembly according to claim 14 wherein the electrical components include a component body having terminals with leads extending therefrom, and wherein said plungers are configured for engaging the leads of an electrical component without applying pressure onto the component body.

18. An assembly according to claim 14 including means for mounting a circuit board onto the lower surface of said body member.

19. An assembly according to claim 18 wherein said mourning means comprises screws securing a circuit board and body member together.

20. An assembly according to claim 14 including a frame for mounting the body member and circuit board secured thereto.

21. An assembly according to claim 14 wherein said lid is pivotally connected to said body member.

* * * * *